United States Patent
Nomura

(10) Patent No.: US 6,822,740 B2
(45) Date of Patent: Nov. 23, 2004

(54) METHOD OF MEASURING DISPLACEMENT OF OPTICAL AXIS, OPTICAL MICROSCOPE AND EVALUATION MARK

(75) Inventor: Hiroshi Nomura, Kawasaki (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 207 days.

(21) Appl. No.: 09/816,164

(22) Filed: Mar. 26, 2001

(65) Prior Publication Data

US 2001/0026366 A1 Oct. 4, 2001

(30) Foreign Application Priority Data

Mar. 28, 2000 (JP) ...................................... 2000-088701

(51) Int. Cl.[7] .......................... G01B 11/00; G01B 11/14
(52) U.S. Cl. ...................................... 356/401; 356/620
(58) Field of Search .............................. 356/399–401, 356/614, 620, 124, 127; 355/53, 55; 382/145, 151; 430/22, 30; 250/548, 559.3, 201.2, 201.4, 201.7, 201.8; 359/368–398, 227, 232–236, 738, 739

(56) References Cited

U.S. PATENT DOCUMENTS

| | | | | |
|---|---|---|---|---|
| 4,362,389 A | * | 12/1982 | Koizumi et al. | 356/401 |
| 4,758,864 A | * | 7/1988 | Endo et al. | 355/43 |
| 5,138,176 A | * | 8/1992 | Nishi | 250/548 |
| 5,200,800 A | * | 4/1993 | Suda et al. | 356/401 |
| 5,243,195 A | * | 9/1993 | Nishi | 250/548 |
| 5,396,335 A | * | 3/1995 | Hasegawa et al. | 356/401 |
| 5,568,257 A | * | 10/1996 | Ota et al. | 356/490 |
| 5,583,609 A | * | 12/1996 | Mizutani et al. | 355/46 |
| 5,674,650 A | * | 10/1997 | Dirksen et al. | 430/22 |
| 5,754,299 A | * | 5/1998 | Sugaya et al. | 356/401 |
| 5,863,712 A | * | 1/1999 | Von Bunau et al. | 355/53 |
| 5,955,739 A | * | 9/1999 | Kawashima | 250/548 |
| 5,969,853 A | * | 10/1999 | Takaoka | 359/370 |
| 6,091,075 A | * | 7/2000 | Shibata et al. | 250/559.44 |
| 6,118,516 A | * | 9/2000 | Irie et al. | 355/53 |
| 6,163,376 A | * | 12/2000 | Nomura et al. | 356/401 |
| 6,172,373 B1 | * | 1/2001 | Hara et al. | 250/548 |

FOREIGN PATENT DOCUMENTS

| | | |
|---|---|---|
| JP | 10-287837 | 10/1998 |
| JP | P2000-122304 | 4/2000 |

OTHER PUBLICATIONS

E. Kawamura, et al., "Novel Optimization of Total Alignment Error Factors", Jpn. J. Appl. Phys., vol. 36, Part 1, pp. 7512–7516, (Dec. 1997).
Derwent Abstract of JP 10287837.

* cited by examiner

Primary Examiner—Zandra V. Smith
Assistant Examiner—Gordon J. Stock, Jr.
(74) Attorney, Agent, or Firm—Finnegan, Henderson, Farabow, Garrett & Dunner, L.L.P.

(57) ABSTRACT

A method of measuring the displacement of the optical axis of an optical microscope having an illumination optical system and a projection optical system includes a step of irradiating the evaluation mark having diffraction grating patterns formed on a substrate with illumination light by way of the illumination optical system and observing the evaluation mark by way of the projection optical system to obtain the brightness of the evaluation mark, and a step of measuring the displacement of the optical axis on the basis of the relationship between the brightness of the image of the evaluation mark and the direction of the diffraction grating patterns of the evaluation mark.

8 Claims, 8 Drawing Sheets

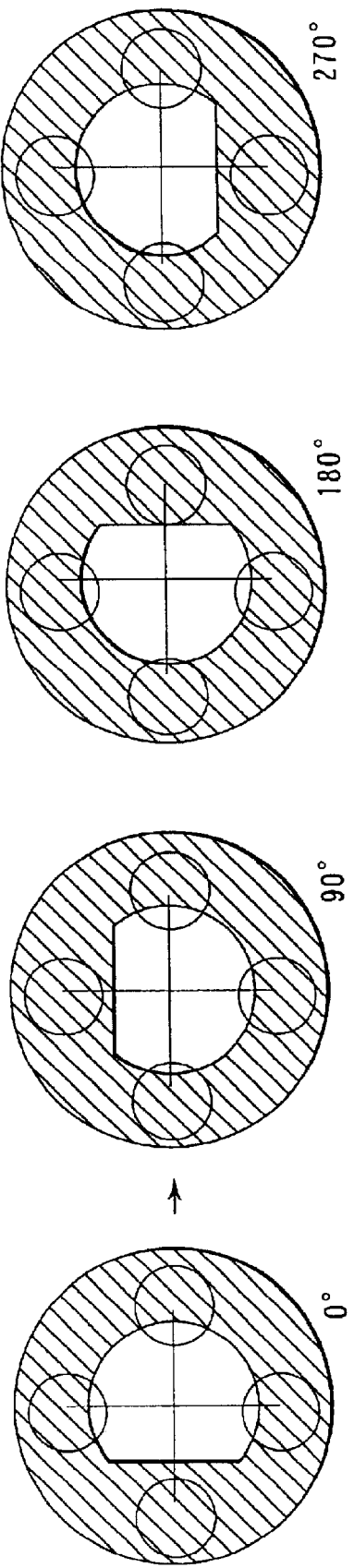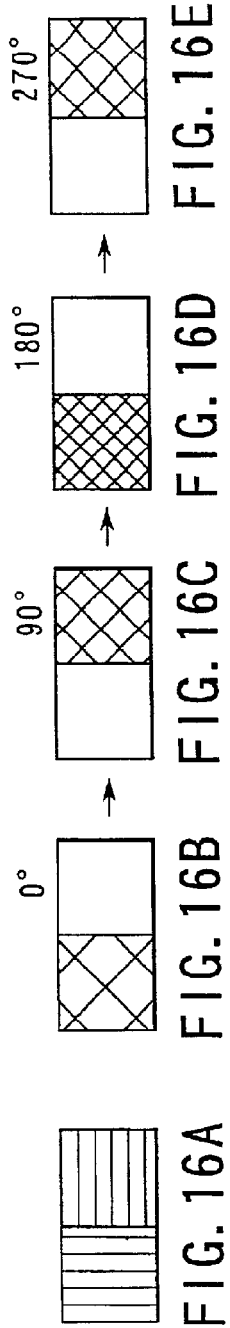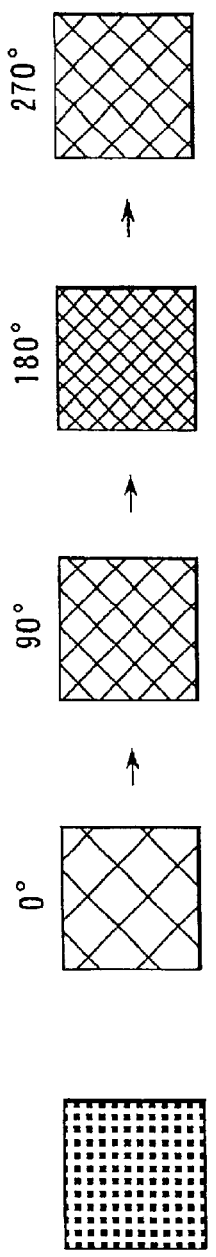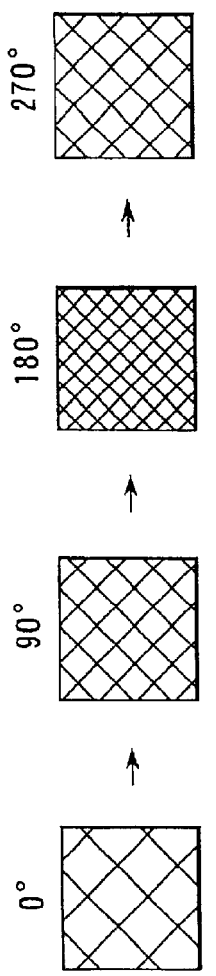
FIG. 15A FIG. 15B FIG. 15C FIG. 15D
FIG. 16A FIG. 16B FIG. 16C FIG. 16D FIG. 16E
FIG. 17A FIG. 17B FIG. 17C FIG. 17D FIG. 17E

METHOD OF MEASURING DISPLACEMENT OF OPTICAL AXIS, OPTICAL MICROSCOPE AND EVALUATION MARK

CROSS-REFERENCE TO RELATED APPLICATIONS

This application is based upon and claims the benefit of priority from the prior Japanese Patent Application No. 2000-088701, filed Mar. 28, 2000, the entire contents of which are incorporated herein by reference.

BACKGROUND OF THE INVENTION

This invention relates to a method of measuring the displacement of the optical axis of an optical microscope that is used in the lithography process for manufacturing semiconductor devices, an optical microscope and an evaluation mark. More particularly, the present invention relates to a method of measuring the displacement of the optical axis of the optical microscope being used for an optical alignment device or an alignment gauge for the purpose of regulating the microscope as well as to an optical microscope and an evaluation mark that can effectively be used with the method.

The process of manufacturing semiconductor devices typically includes a so-called lithography step where the pattern formed on the photomask is transferred onto the resist film applied to the surface of a silicon wafer by means of a demagnification projection aligner and another lithography step that is conducted by using another photomask aligned relative to the transferred pattern after carrying out an etching, ion implanting or film forming operation. Then, the above described sequence of operation is repeated for more than ten times. Meanwhile, semiconductor engineers are paying efforts for designing downsized microchips of semiconductor devices that can reduce the manufacturing cost in terms of each and every function of the device and also show an improved performance. However, since the required accuracy of alignment in the lithography step is ⅓ to ¼ of the minimum line width, downsized microchips of semiconductor devices have to meet rigorous requirements in terms of accuracy of alignment.

Because various factors affect the accuracy of alignment, efforts have to be paid in a concerted manner for the purpose of improving the accuracy. For instance, in the aligner, the precision of the mask stage and the wafer stage has to be improved and the distortion of the demagnification objectives needs to be reduced, while the precision of the alignment device (to be referred to as alignment sensor hereinafter) has also to be improved. In line with these efforts, the flow of air and the propagation of heat in the aligner are being analytically studied.

As for designing and manufacturing semiconductor devices, alignment marks are designed in an ingenious way so as to accommodate the influence of the manufacturing process. Particularly, the planarization of wafer substrates by means of the chemical/mechanical polishing (CMP) technology developed in recent years gives rise to a reduced level of detection signal and asymmetry of alignment marks so that measures for coping with the CMP technology have to be provided when designing alignment marks.

As for alignment gauges for determining the accuracy of alignment (to be referred to as overlay inspection tool hereinafter), efforts are also being paid to improve the accuracy of alignment and reduce the influence of fluctuations in the manufacturing process.

The alignment sensors and the overlay inspection tools that are currently being used mostly comprise an optical magnification microscope as basic component, which is used to pickup a magnified image of the alignment mark formed on the wafer substrate and that of the alignment check mark (to be referred to as bar-in-bar mark hereinafter) by means of a CCD (Charge-Coupled Device) camera. Then, the image data obtained from the picked up images are processed to determine the positions of the marks and the accuracy of alignment thereof. Therefore, the performance of the optical magnification microscope mounted on an alignment sensor or an overlay inspection tool is directly reflected to the accuracy of measurement of the instrument. Thus, the technique and the mechanism for regulating such a microscope need to be of a level much higher than those being used for regulating ordinary optical microscopes.

In view of these circumstances, a number of methods for evaluating the microscope of an alignment sensor or an overlay inspection tool have been proposed. For instance, Jpn. J. Appl. Phys. 36 (1997), pp. 7512–7516 (Reference Document 1) describes a method for observing the asymmetry of the signal representing a pair of steps of a groove cut into a silicon wafer. This method is currently most popularly used to optically regulate microscopes of the type under consideration. Jpn. Pat. Appln. KOKAI No. 10-287837 (Reference Document 2) describes an evaluation method based on the coma of the microscope of the alignment sensor. With this method, wide patterns and narrow patterns are alternately arranged on a silicon wafer at regular intervals and the intervals are observed by means of an alignment sensor.

BRIEF SUMMARY OF THE INVENTION

Therefore, it is the object of the present invention to provide a simple method of measuring the displacement of the optical axis of an optical microscope that is used in the lithography process for manufacturing semiconductor devices as well as an optical microscope and an evaluation mark that can effectively be used with such a method.

According to the invention, the above object is achieved by providing a method of measuring the displacement of the optical axis of an optical microscope having an illumination optical system and a projection optical system, the method having:

a step of irradiating the evaluation mark having diffraction grating patterns formed on a substrate with illumination light by way of the illumination optical system and observing the evaluation mark by way of the projection optical system to obtain the brightness of the evaluation mark; and a step of measuring the displacement of the optical axis on the basis of the relationship between the brightness of the image of the evaluation mark and the direction of the diffraction grating patterns of the evaluation mark.

Since the brightness of the obtained image of the evaluation mark varies as a function of the direction of the diffraction grating patterns and the variance becomes very remarkable when the optical axis is displaced to a large extent. Therefore, measuring the brightness of the image of the evaluation mark is equivalent to measuring the displacement of the optical axis. In other words, the displacement of the optical axis, if any, can be easily detected and measured by observing the brightness of the image of the evaluation mark.

The displacement of the optical axis is evaluated in terms of the direction (for example as expressed by x and y of an x-y orthogonal coordinate system) of the diffraction grating patterns where the brightness of the image of the evaluation mark is maximal. While evaluation mark may be observed for a plurality of times, changing the direction of the substrate and hence that of the evaluation mark, to compare the difference in the brightness among the obtained images of the evaluation mark, the number of observations can be reduced by using an evaluation mark having two or more than two diffraction grating patterns that are arranged in different directions.

The brightness of the image of the evaluation mark has to be differentiated to a large extent in order to improve the sensitivity of observation. This can be realized effectively by block normal light at the position of the pupil of the projection optical system or by blocking a plurality of diffracted beams of light produced by the diffraction grating patterns relative to normal light at the position of the pupil of the projection optical system. An optical microscope according to the invention is devised to realize the latter technique.

The displacement of the optical axis can be evaluated in terms of direction (as expressed by +x or −x and +y or −y of an orthogonal coordinate system) by using a plurality of beams of diffracted light that are produced by the diffraction grating patterns and whose intensities vary asymmetrically relative to normal light.

The above object and other objects as well as the novel features of the present invention will become clear from the following description made by referring to the accompanying drawing.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 15A through 15D are schematic illustrations of the distributions of light at the position of the aperture of the objectives obtained when the microscope of FIGS. 12A and 12B is used;

FIGS. 16A through 16E are schematic illustrations of the change in the intensity of light of the projected image that can be obtained when the evaluation mark of FIG. 15A is used;

FIGS. 17A through 17E are schematic illustrations of the change in the intensity of light of the projected image that can be obtained when the evaluation mark of FIG. 14A is used;

DETAILED DESCRIPTION OF THE INVENTION

Firstly, the problem of the conventional technology that was discovered by the inventor of the present invention and led to the present invention will be described. The above described known evaluation methods are adapted to evaluate mainly the aberration of the lens of a microscope. In other words, it is not possible by any of the known methods to separately evaluate the positional displacement of all the optical elements including those of the illumination optical system for illuminating the mark to be measured on the silicon wafer and the magnification projection optical system for projecting an image of the mark to be measured on the light receiving surface of the CCD camera (to be referred to as displacement of the optical axis hereinafter).

As a result of simulations, the inventor of the present invention came to find that the displacement of the optical axis can remarkably reduce the accuracy of measurement if the measurement is conducted in a defocused state. Additionally, since the mark to be measured on the silicon wafer (silicon substrate) can structurally differ from wafer to wafer or from mark to mark depending on the manufacturing process, it is not always possible to measure marks in a same focused state. Therefore, it is important to accurately know the displacement of the optical axis and feed it back for the purpose of regulating the microscope in order to improve the accuracy of measurement.

1st Embodiment

Figure 1:
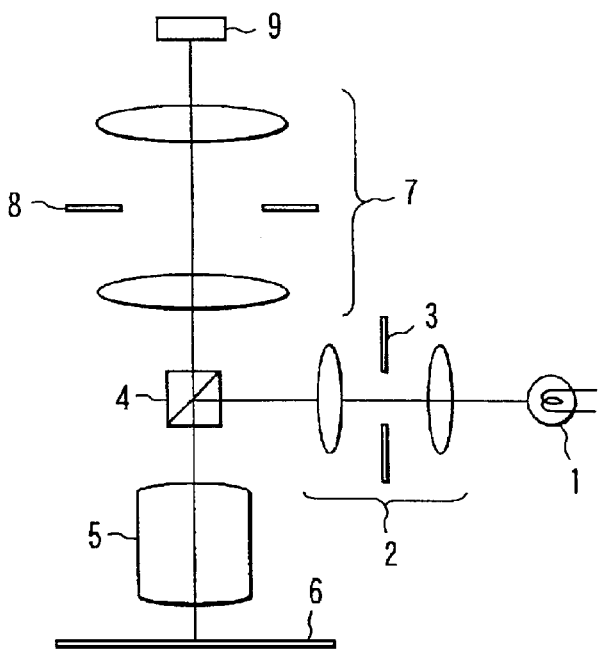
FIG. 1 is a schematic illustration of the first embodiment of microscope mounted on an alignment sensor or an overlay inspection tool.
Figure 2:
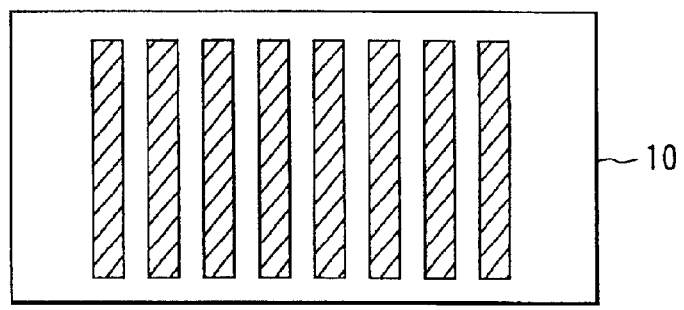
FIG. 2 is a schematic illustration of a conventional alignment mark.

FIG. 1 is a schematic illustration of the first embodiment of optical microscope (to be referred to simply as microscope hereinafter) mounted on an alignment sensor or an overlay inspection tool.

Referring to FIG. 1, reference numeral 1 denotes a halogen lamp and light emitted from the halogen lamp 1 passes through a lighting lens 2 (illumination optical system), a prism 4 and an objective lens 5 to light the pattern on a substrate 6. Then, light reflected by the substrate 6 passes through the objective lens 5 (projection optical system), the prism 4 and a objectives 7 to form a focused image of the mark on the substrate 6 on the light receiving surface of a CCD camera 9. In FIG. 1, reference numeral 3 denotes the aperture of the lighting lens 2 and reference numeral 8 denotes the aperture of the objectives 7.

Figure 3:
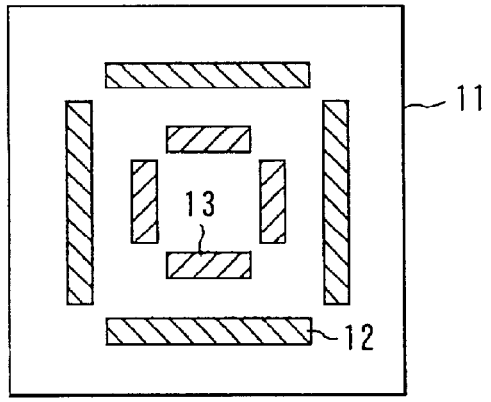
FIG. 3 is a schematic illustration of a conventional bar-in-bar mark.

The mark on the substrate 6 is an alignment mark as shown in FIG. 3 if it is measured by an alignment sensor and a bar-in-bar mark if it is measured by an overlay inspection tool.

For example, the alignment mark 10 may have a structure formed by arranging a 6 μm wide line pattern at a cycle of 12 μm. On the other hand, the bar-in-bar mark 11 may have a structure formed by arranging four 2 μm wide line patterns to produce a square and other four 2 μm wide line patterns to produce another square inside the first square. Referring to FIG. 3, the outer bars 12 and the inner bars 13 are formed independently in respective alignment processes to observe the relative displacement of the outer bars 12 and the inner bars.

Since the residual aberration and the displacement of the optical axis of the microscope mounted on an alignment sensor or an overlay inspection tool significantly affect the accuracy of evaluation of the alignment and that of the overlay, whichever appropriate, it is highly important to correctly known them in order to improve the accuracy. Therefore, the present invention is based on the evaluation of the displacement of the optical axis.

Figure 4:
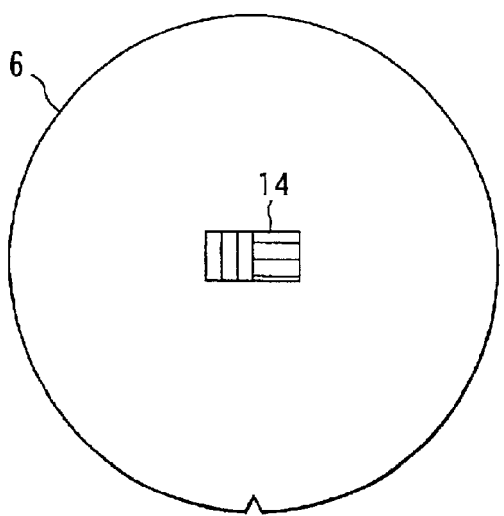
FIG. 4 is a schematic illustration of an evaluation mark that can be used for the first embodiment of the invention.

FIG. 4 is a schematic illustration of an evaluation mark that can be used for the first embodiment of the invention. Referring to FIG. 4, the evaluation mark 14 formed on a substrate 6 shows cyclically arranged patterns, each having dimensions less than or close to the resolution limit of optical microscope.

Figure 5A:
FIGS. 5A through 5C are schematic illustrations of preferred embodiments of evaluation mark according to the invention.
Figure 5B:
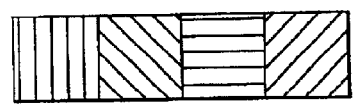
Figure 5C:
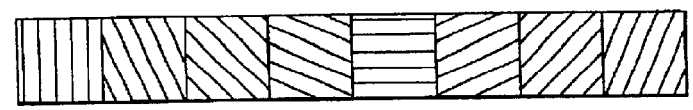

While the diffraction gratings of the evaluation mark 14 may show a same direction, it is advantageous for the purpose of measurement to cyclically arrange patterns in a plurality of directions as shown in FIGS. 5A through 5C because, if the patterns are arranged in a same direction, the direction of the evaluation mark 14 has to be shifted to change the direction of the diffraction grating for each measurement. Then, consequently the number of times of measurements is raised.

Figure 6A:
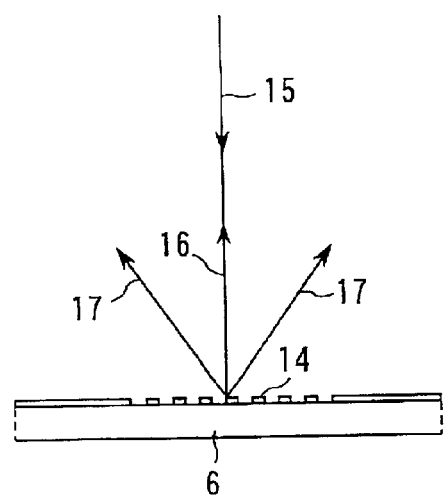
FIGS. 6A and 6B are schematic illustrations of the relationship between the inclination of illumination light and that of diffracted light.

If illuminating light 15 is directed perpendicularly relative to the evaluation mark 14 as shown in FIG. 6A, there appear normal light 16 and primary diffracted light 17. On the other hand, if illuminating light 15 is inclined relative to the evaluation mark 14 as shown in FIG. 6B, both normal light 16 and primary diffracted light 17 are inclined in the same way.

Figure 7A:
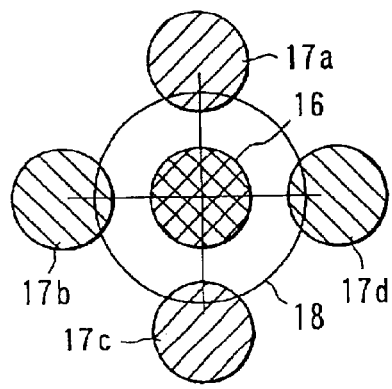
FIGS. 7A and 7B are schematic illustrations showing the distribution of light at the position of the aperture stop of the objectives respectively when illumination light is inclined and when it is not inclined.

When the distribution of light is observed at the position of the aperture 8 of the projecting lens 7, using the evaluation mark of FIG. 5A, the arrangement of FIG. 6A produces a spot of normal light 16 and those of primary diffracted light (17a–17d) that are symmetrically located relative to the circle of the numerical aperture stop (pupil) 18 defined by the aperture 8 of the of the projecting lens 7 as shown in FIG. 7A.

Note that the spots of primary diffracted light 17b, 17d are attributable to the diffraction gratings arranged at the left side of the evaluation mark of FIG. 5A and the beams of primary diffracted light 17a, 17c attributable to the diffraction gratings arranged at the right side of the evaluation mark of FIG. 5A, while only light passing through the inside of the pupil 18 of the projecting lens gets to the light receiving surface of the CCD camera 9.

Figure 6B:
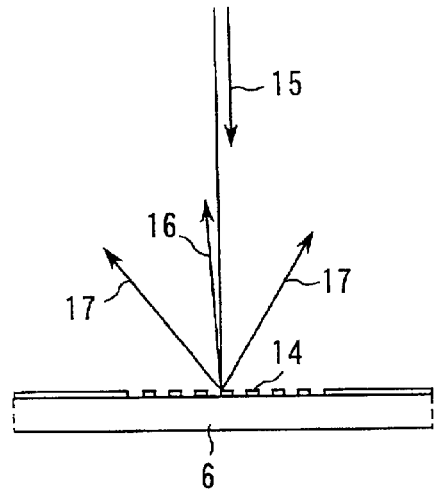
Figure 7B:
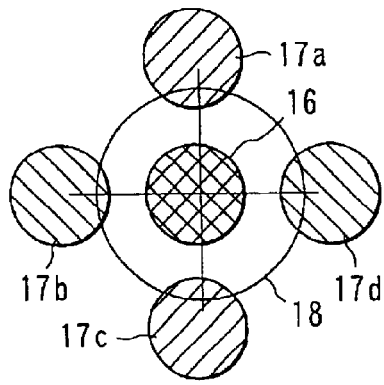

On the other hand, when illuminating light 15 is inclined as shown in FIG. 6B, the spot of normal light 16 and the spots of primary diffracted light (17a–17d) are positionally shifted as a function of the inclination of illuminating light 15 as shown in FIG. 7B. Therefore the quantity of primary diffracted light that passes through the inside of the pupil 18 varies as a function of the directions of the diffraction gratings to give rise to variations in the intensity of light that forms an image of the evaluation mark on the light receiving surface of the CCD camera 9.

The illuminating lens 2 is positionally displaced relative to the projecting lens 7 in the above description. It will be appreciated that a same phenomenon can be observed when the projecting lens 7 is positionally displaced relative to the illuminating lens 2. With the method of the present invention, it is not possible to determine which is actually displaced. However, the displacement of the optical axis is a relative matter and it is not important which of them is actually displaced.

Now, the measurement of the displacement of the optical axis will be described by way of an example. An evaluation mark formed by turning a set of diffraction gratings by 22.5° for a number of times as shown in FIG. 5 was used. The diffraction gratings had a cycle length of 0.55 μm. An overlay inspection tool having a projecting lens with a numerical aperture of 0.5 was used for evaluation.

Figure 8A:
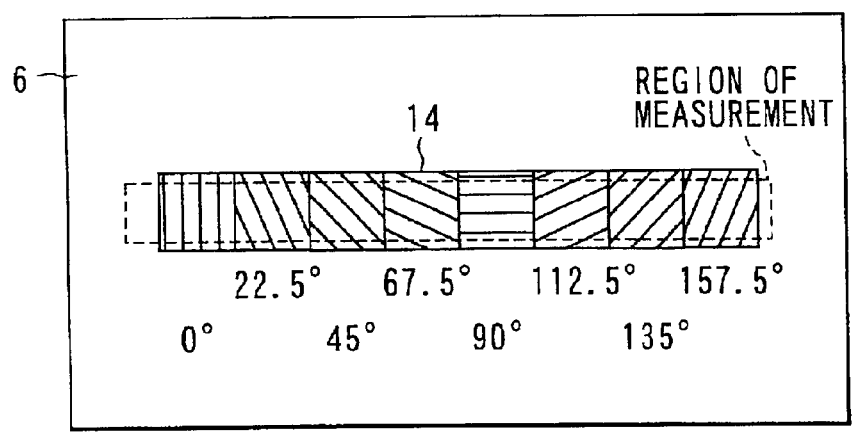
FIGS. 8A and 8B are schematic illustrations of a measured area and the result of a measurement obtained respectively by means of the first embodiment of the invention.
Figure 8B:
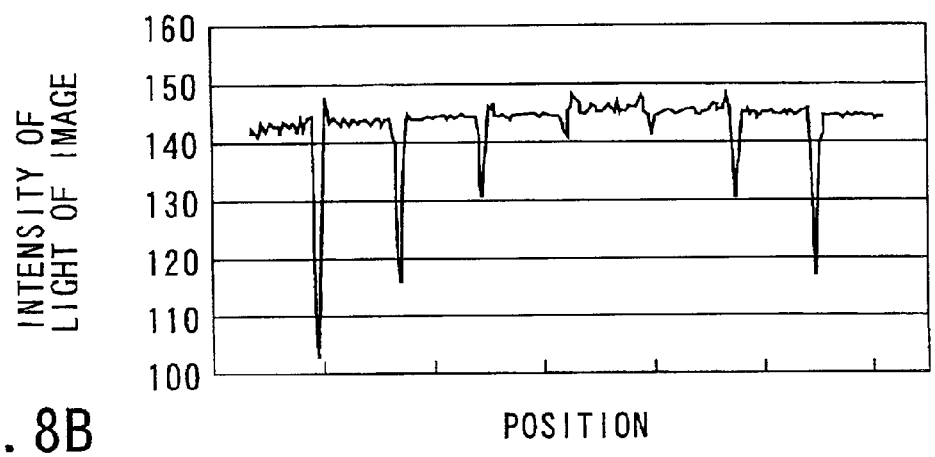

FIG. 8B shows a graph showing how the intensity of light of the image picked up by the CCD camera 9 inside the region defined by dotted lines in FIG. 8A. The patterns of angle 0° and those of angle 90° showed a difference of about 3% in the intensity of light in favor of the patterns of angle 90°. Because this difference may have been caused by the uneven arrangement of the CCD camera 9, same observations were conducted for several times, turning the patterns by 90° each time. However, a similar result was obtained to prove that the optical axis of the microscope was displaced in the direction of the Y-axis. A TIS (Tool Induced Shift) measurement was conducted as ordinary method of evaluating the performance of the overlay inspection tool to also find that the performance was worse in the Y-direction than in the X-direction.

2nd Embodiment

When an evaluation mark of ordinary diffraction gratings is used, the difference in the intensity of light due to the direction of patterns is about 3% as shown in FIG. 8B. This level of sensitivity of measurement may not be satisfactory for devices that are required to be regulated to an enhanced level of accuracy. Therefore, this embodiment is devised to improve the sensitivity of measurement by improving the first embodiment.

As pointed out earlier, the intensity of light of the projected image is directly proportional to the total quantity of beams of light passing through the inside of the pupil 18 of the projecting lens. It will be clear that the intensity of light is governed by normal light 16 by more than 90%. Therefore, the sensitivity of measurement can be improved by reducing the intensity of normal light 16 relative to that of primary diffracted light to the level of nil, if possible. This can be realized either (1) by means of the evaluation mark or (2) by means of the microscope.

Figure 9A:
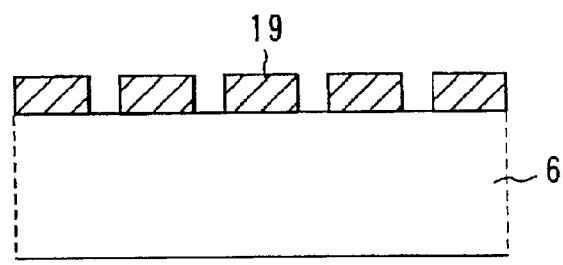
FIGS. 9A and 9B are schematic illustrations of evaluation marks that can be used for the second embodiment of the invention.
Figure 9B:
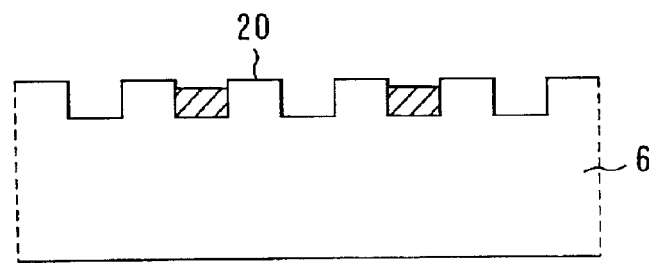

Two types of evaluation mark that can be used to suppress normal light 16 are known. One is the attenuated phase shift type as shown in FIG. 9A and the other is the alternating phase shift type as shown in FIG. 9B. These are applications of the enhancement mask technology.

FIG. 9A shows an evaluation mark formed by arranging diffraction gratings made of reflection reduction film 19 and adapted to control the phase of reflected light. With this film, normal light can be relatively weakened by controlling the phase of reflected light, the intensity of reflection and the duty ratio of the diffraction gratings on the reflection reduction film 19. While the reflection reduction film 19 shows a remarkable effect when it is made of SiNx, any appropriate material may be used for the reflection reduction film 19 to reduce normal light by utilizing the interface effect. It should be noted that the thickness and the phase of the reflection reduction film 19 do not need to be rigorously controlled for reducing the intensity of normal light.

FIG. 9B shows an evaluation mark formed by arranging diffraction gratings and burying a phase control film 20 in every other pattern. With this arrangement, the intensity of normal light can be reduced when the phases of any two adjacent grooves are displaced by 180°. The phase control film 20 may be made of any appropriate material so long as the film thickness is controlled to reduce the intensity of normal light. It should also be noted that the thickness and the phase of the phase control film 20 do not need to be rigorously controlled for reducing the intensity of normal light.

Figure 10A:
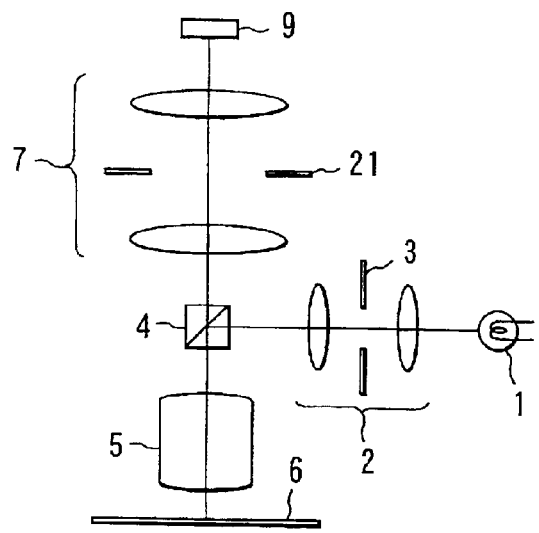
FIGS. 10A and 10B are schematic illustrations of the second embodiment of microscope mounted on an alignment sensor or an overlay inspection tool.
Figure 10B:
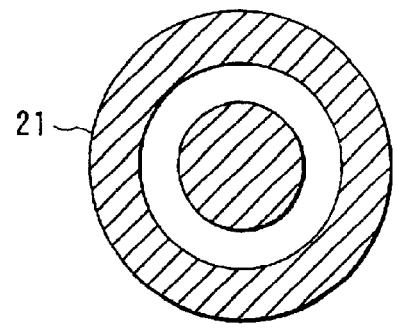

Now, the method of providing the microscope with the function of blocking normal light according to the invention will be described below. This is a technique of shielding a central area of the aperture of the projecting lens in a manner as shown in FIGS. 10A and 10B. When introducing a particular aperture on the optical axis for the projecting lens, the alignment accuracy of the aperture of the projecting lens may be very significant.

While the central shield plate (to be referred to as shield section hereinafter) and the peripheral shield plate (to be referred to as pupil stop hereinafter) for defining the numerical aperture are expressed by a single aperture 21 of the projecting lens in FIGS. 10A and 10B, it is advantageous to make only the shield section removable because problems may arise when the pupil is displaceable and can be positionally shifted each time it is removed and put back again. No rigorous alignment is required to the shield section when it is put in position for the as discussed below.

Figure 11:
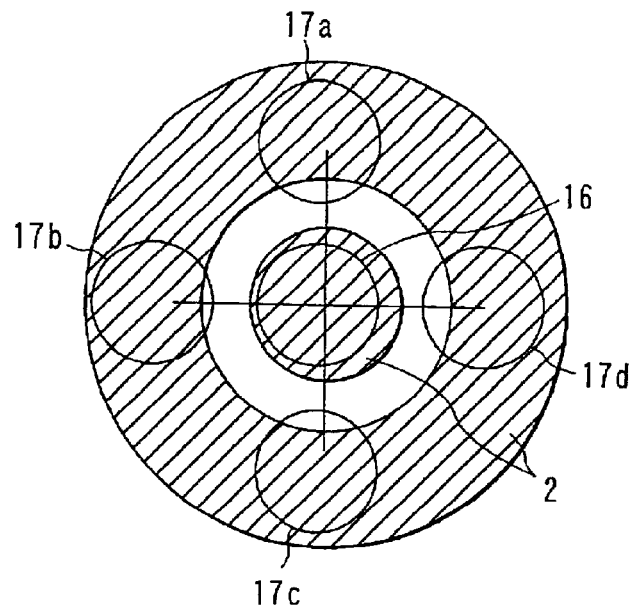
FIG. 11 is a schematic illustration of the distribution of light at the position of the aperture of the objectives obtained when the microscope of FIGS. 10A and 10B is used.

FIG. 11 is a schematic illustration of the distribution of light at the position of the aperture of the objectives obtained when the microscope of FIGS. 10A and 10B is used. The spot of normal light 16 and those of primary diffracted light 17 have a profile similar to that of the aperture 3 of the lighting lens 2. The ratio of the circle representing the numerical aperture of the projected lens 18 to the radius of the spot of normal light 16 is referred to lighting coherence. It is possible for a microscope with a lighting coherence of about 0.5 to reliably secure a sufficient gap separating the spot of normal light 16 and those of primary diffracted light 17 by selecting an appropriate value for the cycle length of diffraction gratings. Then, the shield section is only required so as to be snugly placed in the gap. Thus, the shield section does not require any rigorous alignment.

3rd Embodiment

While the method of evaluating the displacement of the optical axis as described above by referring to the first and second embodiments can be used to know the axis (X or Y) along which the optical axis is displaced, it cannot be used to judge if the displacement along the X-axis is directed to +X or −X. The third embodiment is adapted to find out the direction of displacement of the optical axis.

Figure 12A:
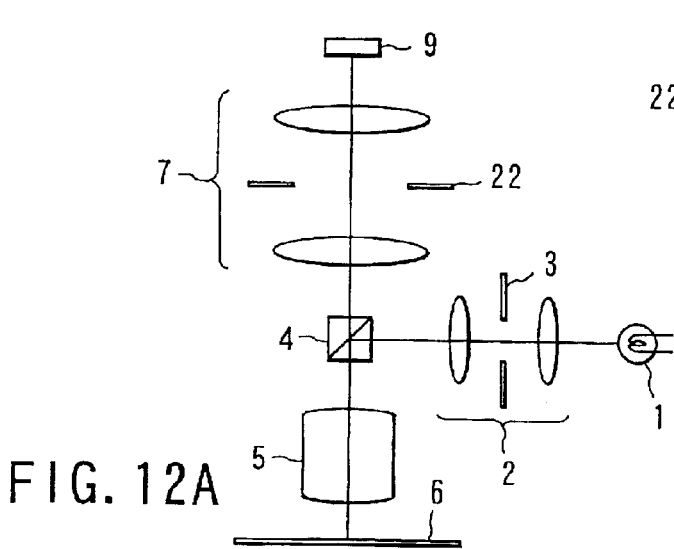
FIGS. 12A and 12B are schematic illustrations of the third embodiment of microscope mounted on an alignment sensor or an overlay inspection tool.
Figure 12B:
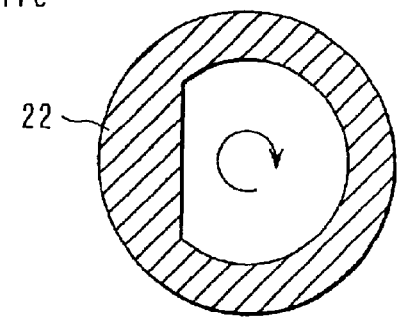

FIGS. 12A and 12B are schematic illustrations of the third embodiment of microscope according to the invention that can be used to determine the direction of displacement of the optical axis. This microscope is characterized in that it is provided with a removable shield section adapted to asymmetrically shield the aperture of the projecting lens and a stop device adapted to rotate the shield section.

While the shield section for asymmetrically shield the aperture of the projecting lens and the numerical aperture are expressed by a single aperture 22 of the projecting lens in FIGS. 12A and 12B, it is advantageous to make only the shield section removable for the reason discussed above by referring to the second embodiment.

Figure 13A:
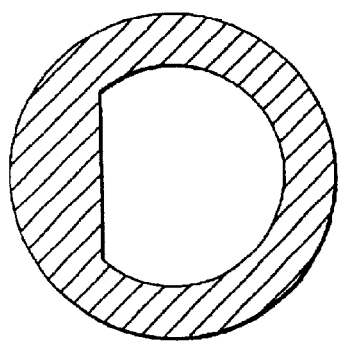
FIGS. 13A through 13C are schematic illustrations of the aperture of the objectives of the microscope of FIGS. 12A and 12B.
Figure 13B:
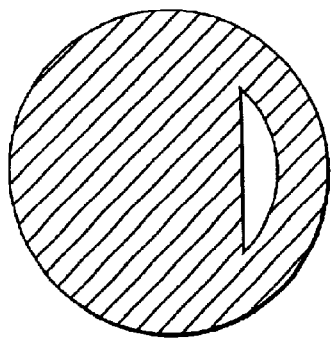
Figure 13C:
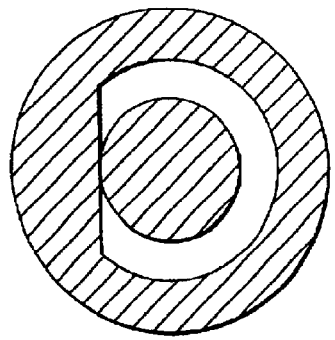

The shield section is adapted to block either of symmetrically produced beams of diffracted light. FIGS. 13A through 13C illustrate specific profiles that can be used for the shield section of the objectives of the microscope of FIGS. 12A and 12B.

Figure 14A:
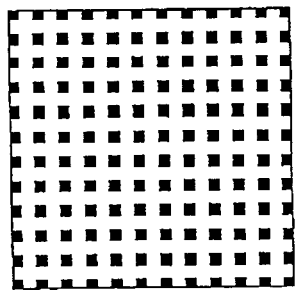
FIGS. 14A through 14C are schematic illustrations of evaluation marks that can be used for the third embodiment of the invention.
Figure 14B:
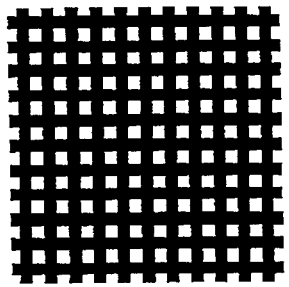
Figure 14C:
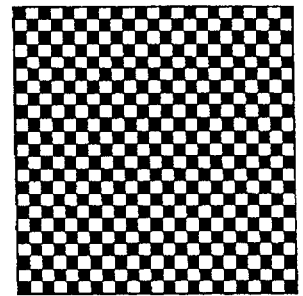

More specifically, FIGS. 13B and 13C show profiles obtained by modifying that of FIG. 13A. They are adapted to block diffracted light and also normal light. Particularly, the profile of FIG. 13C is devised to make the pattern layout on the substrate easily comprehensible by allowing all orthogonally arranged beams of diffracted light to pass therethrough. Note that not only the marks shown in FIGS. 5A through 5C but also those of checkerwork as shown in FIGS. 14A through 14C may also be used for this embodiment.

Specific examples of evaluation marks and their effects will be described by referring to FIGS. 15A through 15D, FIGS. 16A through 16E and FIGS. 17A through 17E. FIGS. 15A through 15D are schematic illustrations of the distributions of light at the position of the aperture of the objectives obtained when that of FIG. 13A is used. More specifically, they show the displacement of the optical axis and the direction of the aperture of the projecting lens 22 (0°, 90°, 180°, 270°). FIGS. 16A through 16E are schematic illustrations of the change in the intensity of light of the projected image that can be obtained when the evaluation mark of FIG. 15A is used, whereas FIGS. 17A through 17E are schematic illustrations of the change in the intensity of light of the projected image that can be obtained when the evaluation mark of FIG. 14A is used. Thus, with this embodiment, it is possible to reliably evaluate the displacement of the optical axis.

4th Embodiment

Figure 18A:
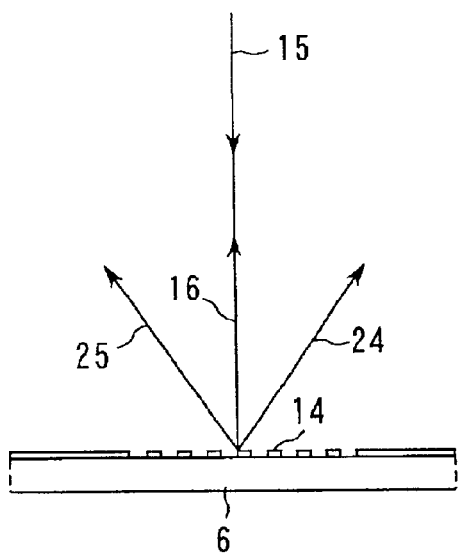
FIGS. 18A and 18B are schematic illustrations of the fourth embodiment of method of measuring the displacement of the optical axis.
Figure 18B:
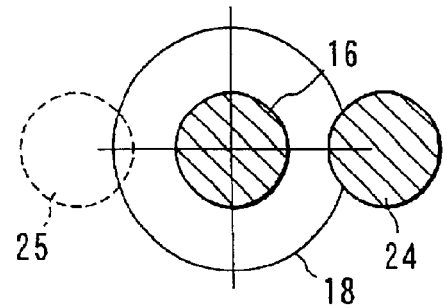

The displacement of the optical axis can be evaluated to include the direction of displacement not only by using the aperture of the projecting lens 22 as described above by referring to the third embodiment but by causing the evaluation mark to show one or more than one characteristic features. FIGS. 18A and 18B are schematic illustrations of the fourth embodiment of method of measuring the displacement of the optical axis that uses diffraction gratings adapted to asymmetrically produce beams of diffracted light.

Figure 19A:
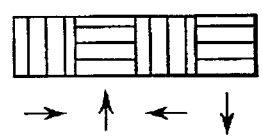
FIGS. 19A through 19E are schematic illustrations of an evaluation mark that can be used for the fourth embodiment and the distribution of light at the position of the aperture of the objectives that can be obtained when it is used.
Figure 19B:
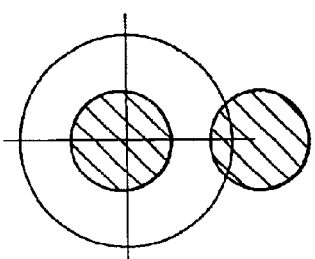
Figure 19C:
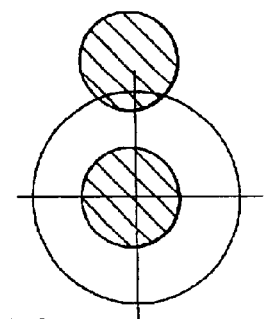
Figure 19E:
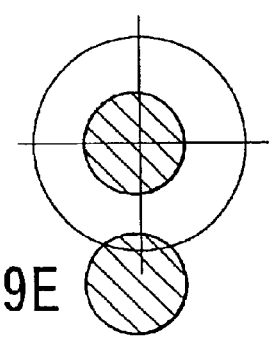
Figure 19D:
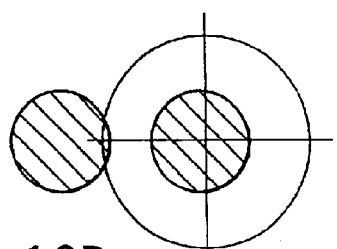

If the beams of positive primary diffracted light 24 that are diffracted rightward and those of negative primary diffracted light 25 that are diffracted leftward show a large difference of intensity, the distribution of light at the position of the aperture of the projecting lens will be like that of FIG. 18B. If an evaluation mark 14 as shown in FIG. 19A is prepared by using such diffraction gratings, the distribution of light obtained at the position of the aperture of the projecting lens will be any of those illustrated in FIGS. 19B through 19E so that the displacement of the optical axis can be evaluated to include the direction. The arrow in FIG. 19A indicated the direction along which strong primary diffracted light is produced.

Figure 20A:
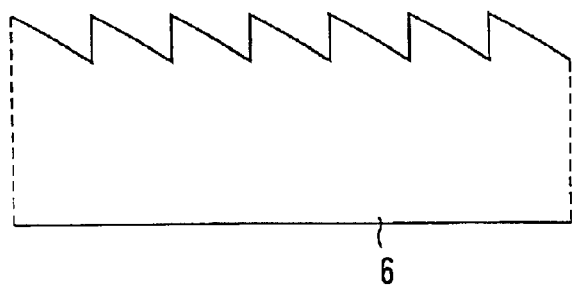
FIGS. 20A through 20D are schematic cross sectional views of evaluation marks that can be used for the fourth embodiment.

FIGS. 20A through 20D are schematic cross sectional views of evaluation marks that can be used for the fourth embodiment and adapted to asymmetrically produce beams of diffracted light. Of the figures, FIG. 20A shows diffraction gratings showing a saw-blade like cross sectional view. With this arrangement, the intensity of light diffracted rightward is stronger than that of light diffracted leftward.

Figure 20B:
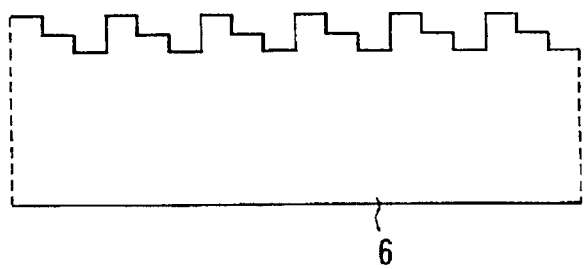

While it is difficult to prepare an evaluation mark having a structure as shown in FIG. 20A by means of any currently available semiconductor process, one having a stepped structure as shown in FIG. 20B can be prepared without difficulty by repeating an etching process for a plurality of times. While FIG. 20B shows a mark having two steps, one having three or four steps may similarly be effective.

Figure 20C:
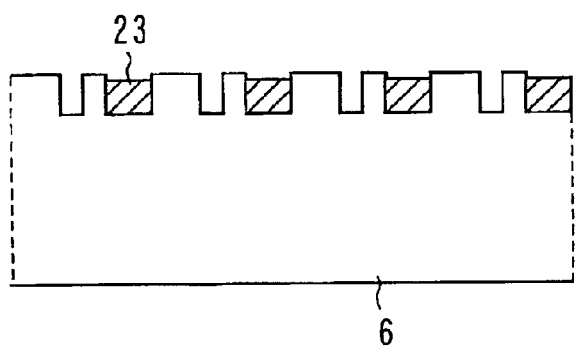

FIG. 20C shows an evaluation mark of diffraction gratings where grooves of two different types that are different in terms of width are arranged alternately and the grooves of either type are filled with a material adapted to control the reflectivity and the phase.

Figure 20D:
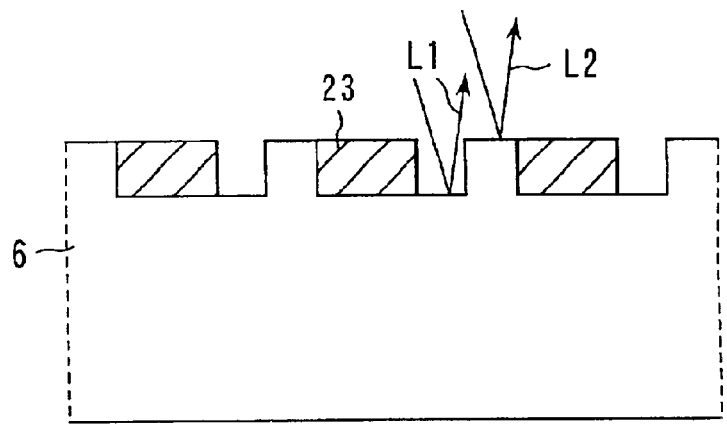

FIG. 20D shows an evaluation mark of diffraction gratings where grooves are formed with a same and identical width and reflection reduction film or phase control film 23 is buried in part of each and every groove. The evaluation mark is so designed that the phase of light L1 reflected by the bottom area of each groove where no reflection reduction film nor phase control film 23 is buried and that of light L2 reflected by the surface of the substrate do not show a difference of 180°. The phase of light L1 and that of light L2 are preferably differentiated by 90°.

Since an evaluation mark of diffraction gratings showing steps as illustrated in FIG. 20B is prepared by repeating a cycles of pattern alignment, etching, mark alignment, etching, ... , an alignment error can arise between the first alignment and the next alignment.

Since such a positional error can affect the difference in the diffraction efficiency of the patterns of different directions because the diffraction gratings are made to face various respective directions as shown in FIG. 19A, it is difficult to know if the difference in the intensity of light of the image is attributable to the possible displacement of the optical axis or to the difference of diffraction efficiency of the patterns.

The arrangement of FIG. 20B is advantageous if the cycle length is large and the alignment error at the time of aligning operation is negligible, whereas that of FIG. 20C is advantages if the alignment error is not negligible.

The arrangement of FIG. 20C can be realized by using a process of burying reflection reduction film with a controlled phase, phase control film or reflection reduction film 23 in the grooves formed in the substrate 6, planarizing the surface and removing the material in the grooves of either type by peeling it off. Then, the influence of any alignment error can be disregarded to produce the structure of the arrangement of FIG. 20C.

FIG. 20D shows an arrangement that can be realized by using a process of burying reflection reduction film with a controlled phase, phase control film or reflection reduction film 23 in the grooves formed in the substrate 6, planarizing the surface and selectively removing part of the material in each of the grooves by peeling it off. Then, again, the influence of any alignment error can be disregarded to produce the structure of the arrangement of FIG. 20D.

While an evaluation mark is formed on a substrate in the above description, it may alternatively be formed in the microscope. For instance, an evaluation mark may be formed on the stage for carrying a substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of measuring a displacement of an optical axis of an optical microscope having an illumination optical system and a projection optical system, the method comprising:

a step of irradiating an evaluation mark having diffraction grating patterns formed on a substrate with illumination light by way of the illumination optical system and observing the evaluation mark by way of the projection optical system to obtain a brightness of an image of an area of the evaluation mark, the area including the diffraction grating patterns; and a step of measuring the displacement of the optical axis based upon the relationship between the brightness of the image of the area of the evaluation mark and a direction of the diffraction grating patterns of the evaluation mark.

2. The method of measuring the displacement of the optical axis according to claim 1, wherein the evaluation mark is composed of at least two gratings connected together and arranged in series with each other, each having parallel bars that extend in a direction different from those of any other grating.

3. The method of measuring the displacement of the optical axis according to claim 1, wherein normal light of the illumination light is blocked at the position of the pupil of the projection optical system.

4. The method of measuring the displacement of the optical axis according to claim 2, wherein diffracted light of the illumination light is blocked at the position of the pupil of the projection optical system.

5. The method of measuring the displacement of the optical axis according to claim 1, wherein a plurality of beams of diffracted light produced by the diffraction grating patterns are blocked asymmetrically at the position of the pupil of the projection optical system relative to normal light of the illumination light by the substrate.

6. The method of measuring the displacement of the optical axis according to claim 2, wherein a plurality of beams of diffracted light produced by the diffraction grating patterns are blocked asymmetrically at the position of the pupil of the projection optical system relative to normal light of the illumination light from the substrate.

7. The method of measuring the displacement of the optical axis according to claim 1, wherein diffracted light is generated by the diffraction grating patterns with asymmetrically differentiated intensity relative to normal light.

8. The method of measuring the displacement of the optical axis according to claim 2, wherein diffracted light is generated by the diffraction grating patterns with asymmetrically differentiated intensity relative to normal light.

* * * * *